(12) United States Patent
Mikasa

(10) Patent No.: US 7,696,576 B2
(45) Date of Patent: Apr. 13, 2010

(54) SEMICONDUCTOR DEVICE THAT INCLUDES TRANSISTORS FORMED ON DIFFERENT SILICON SURFACES

(75) Inventor: Noriaki Mikasa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 340 days.

(21) Appl. No.: 11/727,755

(22) Filed: Mar. 28, 2007

(65) Prior Publication Data

US 2007/0228478 A1 Oct. 4, 2007

(30) Foreign Application Priority Data

Mar. 28, 2006 (JP) ............................. 2006-087147
Dec. 28, 2006 (JP) ............................. 2006-355229

(51) Int. Cl.
*H01L 29/772* (2006.01)
(52) U.S. Cl. ....................... 257/365; 257/369; 257/390; 257/E29.018

(58) Field of Classification Search .......... 257/E29.018; 438/295
See application file for complete search history.

(56) References Cited

U.S. PATENT DOCUMENTS 6,300,649 B1 * 10/2001 Hu et al. ...................... 257/69
7,521,302 B2 * 4/2009 Park ........................... 438/164

* cited by examiner

*Primary Examiner*—Stephen W Smoot
(74) *Attorney, Agent, or Firm*—Young & Thompson

(57) ABSTRACT

According to the present invention, it is possible to isolate elements from each other without formation of STI and integrate the elements at a high density. A step is formed on a surface of a silicon substrate so as to provide different surfaces. Transistors are formed on the respective different surfaces. The transistors are insulated from each other by a silicon layer and an insulating sidewall. Since no STI is formed between the transistors, it is possible to integrate the transistors at a high density.

19 Claims, 11 Drawing Sheets

SEMICONDUCTOR DEVICE THAT INCLUDES TRANSISTORS FORMED ON DIFFERENT SILICON SURFACES

This application claims priority to prior applications JP 2006-087147 and JP 2006-355229, the disclosures of which are incorporated herein by reference.

BACKGROUND OF THE INVENTION

The present invention relates to a semiconductor device having a plurality of transistors required to be isolated from each other on a silicon substrate and a method of manufacturing such a semiconductor device.

Nowadays, this type of semiconductor devices used for DRAMs tends to employ shallow trench isolation (STI) technology in order to isolate a plurality of transistors from each other, instead of local oxidation of silicon (LOCOS) technology. For example, Japanese laid-open patent publication No. 9-129721 (Patent Document 1) discloses a method of manufacturing a semiconductor device with STI technology.

Specifically, Patent Document 1 discloses a method of manufacturing a semiconductor device which can improve a difference in threshold voltage between the centers of active regions isolated by STI and corner portions of the active regions adjacent to the STI. However, Patent Document 1 fails to teach or suggest that a range in which a circuit area can be reduced has a limitation in a case where elements are insulated from each other by formation of trenches. Thus, with use of STI technology according to Patent Document 1, a degree of integration of elements is disadvantageously limited by the width and depth of trenches.

The aforementioned disadvantage will be described in greater detail with reference to a general manufacturing method of a semiconductor device which uses STI technology as shown in FIGS. 1 to 5.

First, an insulator film 11 is formed on a silicon substrate (e.g., a p-type silicon substrate) 10. An active region is covered with a photoresist (not shown). The insulator film 11 is dry-etched at a non-active region while the photoresist is used as a mask. Next, while the etched insulator film 11 is used as a mask, the silicon substrate 10 is dry-etched at the non-active region so as to form a trench 12 in the silicon substrate 10 (see FIG. 1).

Subsequently, in order to isolate elements, such as transistors, from each other, an insulator film 13 is deposited on the silicon substrate 10 and within the trench 12. Then chemical mechanical polishing (CMP) is performed on the insulator film 13. At that time, the insulator film 11 serves as a stopper for CMP. Next, the insulator films 13 and 11 are wet-etched in order to match the height of the insulator film 13 with a surface of the silicon substrate 10. As shown in FIG. 2, STI is formed so that the insulator film 13 remains within the trench 12. Thus, element formation regions isolated by the STI, i.e., active regions 141 and 142, are formed in the silicon substrate 10. Well isolation regions for electrical isolation from adjacent elements may be formed below the active regions 141 and 142 by implantation.

After the formation of the STI, a gate oxide film 15 is formed on the active regions 141 and 142 of the silicon substrate 10 by thermal oxidation or the like. Subsequently, a gate electrode 16 having a plurality of layers (three layers in FIG. 3) is formed on the gate oxide film 15. Furthermore, an insulator film 17 is deposited on the gate electrode 16. After that, while a photoresist is used as a mask, the gate electrode 16 and the insulator film 17 are dry-etched. Thus, as shown in FIG. 3, gates 18 and 19 including the gate oxide film 15 and the insulator film 17 are formed on the active regions 141 and 142 of the silicon substrate 10.

Next, an insulator film for formation of gate sidewalls is deposited and then dry-etched so as to form gate sidewalls 20. Furthermore, an insulator film for formation of a gate interlayer dielectric film is deposited on the silicon substrate 10. Then CMP is performed so as to form a gate interlayer dielectric film 21 (see FIG. 4).

Finally, while a photoresist is used as a mask, the insulator film 21 is dry-etched so as to form source/drain contacts for the transistors including the gates 18 and 19, respectively, at the active regions of the silicon substrate 10. Specifically, source/drain contacts 22 and 23 are formed for the gate 18 whereas source/drain contacts 24 and 25 are formed for the gate 19 (see FIG. 5).

FIG. 6 shows a two-dimensional arrangement of the semiconductor device shown in FIG. 5. FIG. 5 is a cross-sectional view taken along line A-A of FIG. 6. In FIG. 6, active regions 141 and 142 are arranged in a transverse direction (row direction) and a longitudinal direction (column direction). The active regions 141 and 142 arranged in the row direction and the column direction are insulated from each other by the insulator film 13 provided in the trench, i.e., the STI. The gates 18 and 19 are provided on the active regions 141 and 142, respectively. The common gate 18 is provided on the active regions 141 arranged in the column direction, and the common gate 18 is provided on the active regions 142 arranged in the column direction.

As shown in FIG. 6, portions around the active regions 141 and 142 are surrounded by the STI. Accordingly, in order to reduce a circuit area, it is necessary to reduce the size of the STI between the active regions, i.e., the size of the trench.

However, reduction of the size of the trench has limitations caused by formation of the trench, embedment of the insulator film 13 for isolation, and the like. Furthermore, reduction of the width and depth of the trench causes deterioration of insulating properties between elements.

SUMMARY OF THE INVENTION

The present invention has been made in view of the above drawbacks. It is, therefore, an object of the present invention to provide a semiconductor device capable of isolating elements from each other without formation of STI and a method of manufacturing such a semiconductor device.

Another object of the present invention is to provide a semiconductor device capable of reducing a circuit area to a large extent as compared to a case in which trenches are formed between elements, and to provide a method of manufacturing such a semiconductor device.

A specific object of the present invention is to provide a DRAM capable of arranging memory cells at a high density and a method of manufacturing such a DRAM.

In order to attain the above objects, according to a first aspect of the present invention, there is provided a semiconductor device including a first transistor formed on a first silicon surface and a second transistor formed on a second silicon surface located at a height different from a height of the first silicon surface. The first transistor and the second transistor are insulated from each other.

The semiconductor device may further include a silicon substrate having a surface forming the first silicon surface and a silicon layer formed on a surface of the silicon substrate by epitaxial growth. The silicon layer has a surface forming the second silicon surface located higher than the first silicon surface.

The semiconductor device may include no STI formed between the first transistor and the second transistor.

The semiconductor device may further include a lower transistor group including a plurality of the first transistors and an upper transistor group including a plurality of the second transistors. The first silicon surface and the second silicon surface may be arranged alternately in a row direction and a column direction perpendicular to each other in a plan view. The first transistors on the first silicon surface and the second transistors on the second silicon surface may be staggered in the plan view.

The semiconductor device may further include a sidewall of an insulator film between a region for the second transistor formed on the second silicon surface and a region for the first transistor formed on the first silicon surface.

Each of the first transistor and the second transistor may be a MOS transistor having the same conductivity.

Each of the first transistors in the lower transistor group may include a first gate portion having a stacked structure including a lower gate part and an upper gate part connected by a gate connection part. Each of the second transistors in the upper transistor group may include a second gate portion having a single-stage structure.

An upper surface of the first gate portion in each of the first transistors and an upper surface of the second gate portion in each of the second transistors may be located on substantially the same plane.

The first gate portions and the second gate portions of the first transistors and the second transistors arranged alternately in the column direction may include a common gate electrode formed on the same plane as the upper surfaces of the first gate portions and the second gate portions.

The silicon substrate may be a p-type silicon substrate, and each of the first transistors and the second transistors may be an NMOS transistor.

The first transistors and the second transistors may be CMOS transistors formed by different conductive types of transistors.

Each of the first transistors of CMOS transistors may include a first gate portion having a stacked structure including a lower gate part and an upper gate part connected by a gate connection part. Each of the second transistors of CMOS transistors may include a second gate portion having a single-stage structure.

An upper surface of the first gate portion in each of the first transistors of CMOS transistors and an upper surface of the second gate portion in each of the second transistors of CMOS transistors may be located on substantially the same plane.

The first gate portions and the second gate portions of the first transistors and the second transistors of CMOS transistors arranged alternately in the column direction may include a common gate electrode formed on the same plane as the upper surfaces of the first gate portions and the second gate portions.

The silicon substrate may be a p-type silicon substrate, each of the first transistors may be an NMOS transistor, and each of the second transistors may be a PMOS transistor.

According to a second aspect of the present invention, there is provided a semiconductor device including a silicon substrate, a first transistor formed on the silicon substrate, a silicon layer formed adjacent to the first transistor on a surface of the silicon substrate by selective epitaxial growth, and a second transistor formed on the silicon layer so as to be isolated from the first transistor by the silicon layer.

The semiconductor device may further include a sidewall of an insulator film formed on a side surface of the silicon layer.

A first distance between an edge of a first gate portion of the first transistor and the sidewall may be substantially the same as a second distance between an edge of a second gate portion of the second transistor and the sidewall.

The semiconductor device may further include a first insulator film covering the first transistor and a second insulator film covering the second transistor and having substantially the same height as a height of the first insulator film.

According to a third aspect of the present invention, there is provided a method of manufacturing a semiconductor device. In this method, a first silicon surface and a second silicon surface are formed at different heights on a silicon substrate. A first transistor is formed on the first silicon surface. A second transistor is formed on the second silicon surface.

In the forming process of the first silicon surface and the second silicon surface, selective epitaxial growth may be performed on the silicon substrate defining the first silicon surface so as to form the second silicon surface located higher than the first silicon surface.

In the forming process of the first silicon surface and the second silicon surface, the first silicon surface and the second silicon surface may be arranged alternately in a row direction and a column direction perpendicular to each other in a plan view.

An insulator film may be formed for insulating the first transistor formed on the first silicon surface and the second transistor formed on the second silicon surface from each other.

In the forming process of the first transistor, a first gate portion may be formed on the first silicon surface, and source and drain regions may be formed on the first silicon surface. In the forming process of the second transistor, a second gate portion may be formed on the second silicon surface, and source and drain regions may be formed on the second silicon surface.

In the forming process of the first gate portion of the first transistor, a lower gate part may be formed, a contact plug may be formed on the lower gate part, and an upper gate part may be formed on the contact plug. The forming process of the second gate portion of the second transistor may be performed during the forming process of the upper gate part of the first gate portion.

In the arranging process of the first silicon surface and the second silicon surface, a lower gate part including a gate insulator film, a gate electrode, and a cover insulator film may be formed on a surface of the silicon substrate, and source and drain diffusion layers may be formed on the surface of the silicon substrate. A first insulator film may be formed on an entire surface of the silicon substrate so as to cover the lower gate part with the first insulator film. The first insulator film may be dry-etched until the surface of the silicon substrate is exposed with the lower gate part being embedded in the first insulator film.

In the dry-etching process of the first insulator film, the first insulator film may be etched deeper than a height of the source and drain diffusion layers formed on the surface of the silicon substrate.

A sidewall of an insulator film may be formed on a side surface of the first insulator film after the dry-etching process of the first insulator film.

The sidewall of the insulator film may include a single layer of a silicon nitride film or a silicon oxide film or a two-layer film of a silicon nitride film and a silicon oxide film formed on the silicon nitride film.

According to the present invention, elements can be isolated from each other without formation of STI. Accordingly, it is possible to reduce an area as compared to the prior art in which STI is formed. Specifically, a semiconductor device according to the present invention can reduce an area to about two-thirds as compared to a case in which elements are isolated by STI. Furthermore, the present invention is advantageous in fine patterning because an etching process and an embedment process of an insulator film can be performed on a large area. Moreover, according to the present invention, it is also possible to obtain excellent electrical insulating properties by sufficiently increasing the height of a silicon epitaxial growth layer used for insulation.

The above and other objects, features, and advantages of the present invention will be apparent from the following description when taken in conjunction with the accompanying drawings which illustrate preferred embodiments of the present invention by way of example.

DETAILED DESCRIPTION OF THE PREFERRED EMBODIMENTS

Figure 7:
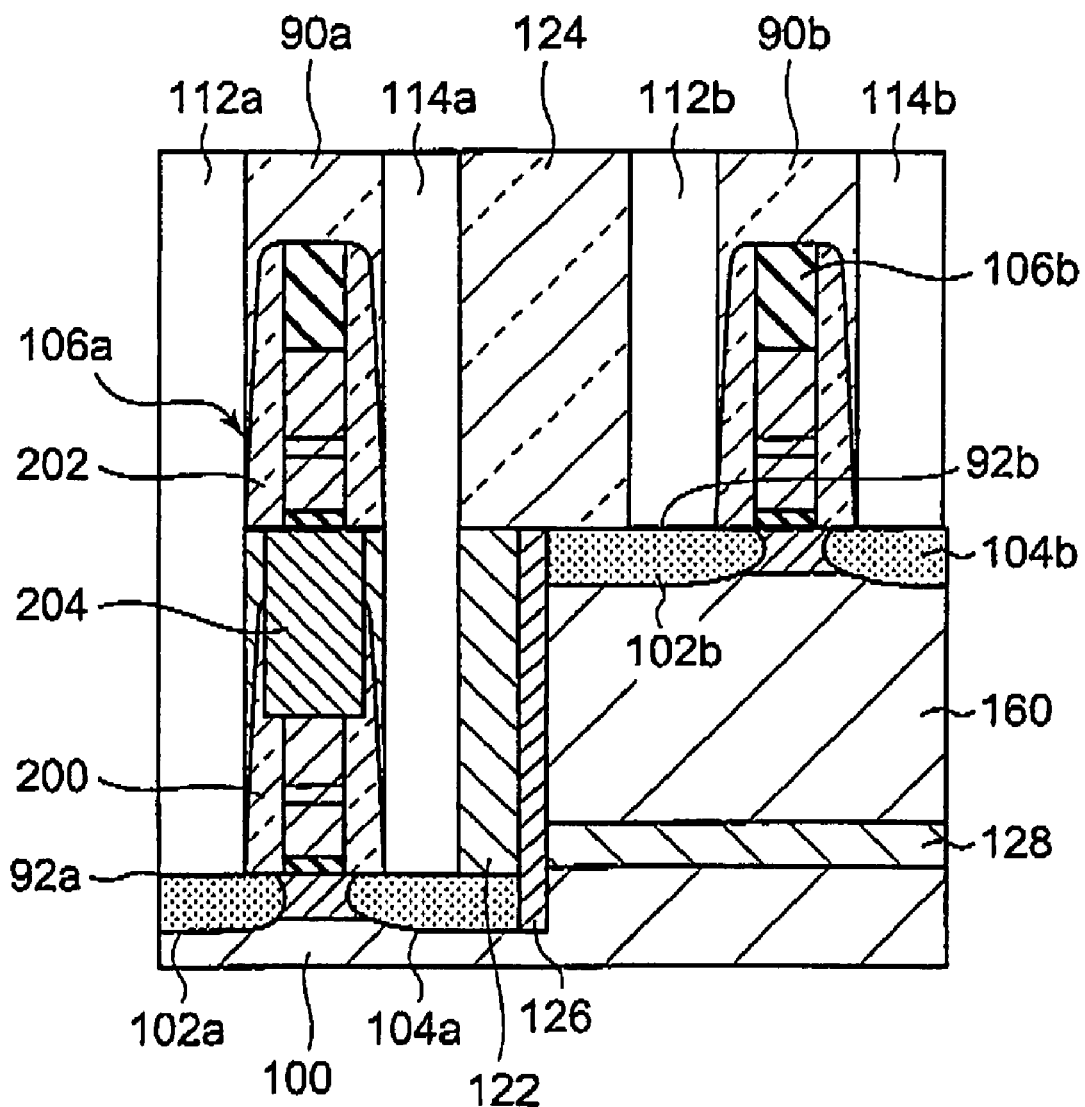
FIG. 7 is a view showing a schematic arrangement of a semiconductor device according to an embodiment of the present invention.

A structure of a semiconductor device according to an embodiment of the present invention will be described below with reference to FIGS. 7 and 8. As shown in FIG. 7, a semiconductor device according to the present invention includes two transistors (a first transistor 90a and a second transistor 90b) formed on two different planes. In this example, each of the first and second transistors 90a and 90b is an NMOS transistor. In this case, a p-type silicon substrate is prepared as a silicon substrate 100. The first transistor 90a is formed on a first surface 92a of the silicon substrate 100. The p-type silicon substrate 100 has a step on the first surface 92a so that a second surface 92b is formed at a position higher than the first surface 92a. The second transistor 90b is formed on the second surface 92b.

In the illustrated example, a silicon layer 160 is formed on the first surface 92a of the silicon substrate 100. The second transistor 90b is formed on the surface 92b of the silicon layer 160. In this example, the silicon layer 160 is formed by selective epitaxial growth of p-type silicon on the silicon substrate 100.

The first transistor 90a formed on the surface 92a of the silicon substrate 100 includes a source region 102a, a drain region 104a, and a first gate portion 106a.

The second transistor 90b formed on the surface 92b of the silicon layer 160 includes a source region 102b, a drain region 104b, and a second gate portion 106b. Contact holes 112a and 114a for source and drain electrodes are formed above the source region 102a and the drain region 104a, respectively. Similarly, contact holes 112b and 114b for source and drain electrodes are formed above the source region 102b and the drain region 104b, respectively.

The contact holes 112a and 114a for source and drain electrodes are formed by etching an insulator film 122 formed on the silicon substrate 100 and an insulator film 124 formed after the formation of the silicon layer 160.

As shown in FIG. 7, the first transistor 90a is covered with the insulator film 122 and the insulator film 124, and the second transistor 90b is covered with the insulator film 124. Furthermore, the first gate portion 106a has an upper surface located substantially at the same height as a height of an upper surface of the second gate portion 106b.

Figure 1:
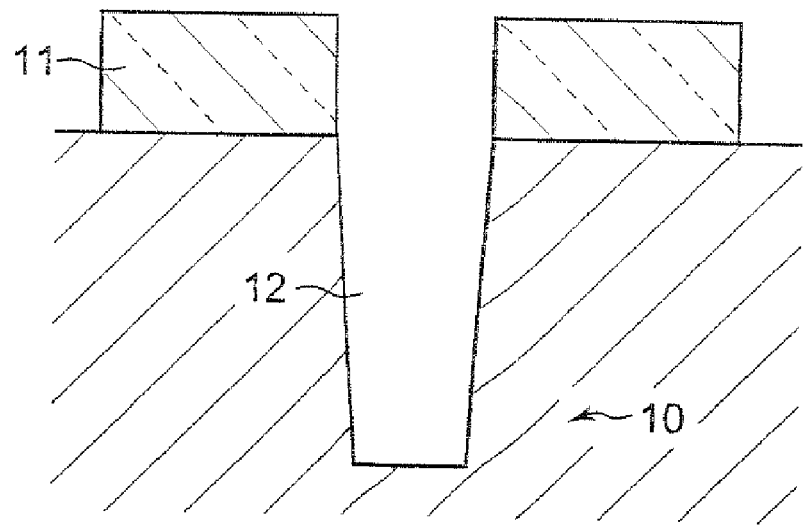
FIG. 1 is a view explanatory of a conventional manufacturing process of a semiconductor device with use of STI.
Figure 2:
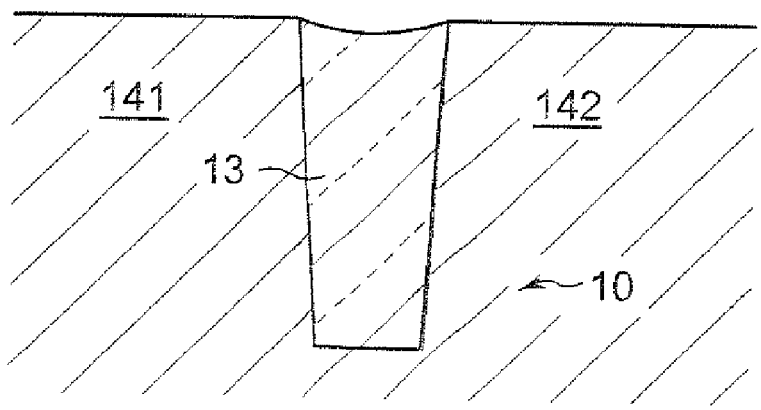
FIG. 2 is a view explanatory of a process to be performed after the process shown in FIG. 1.
Figure 3:
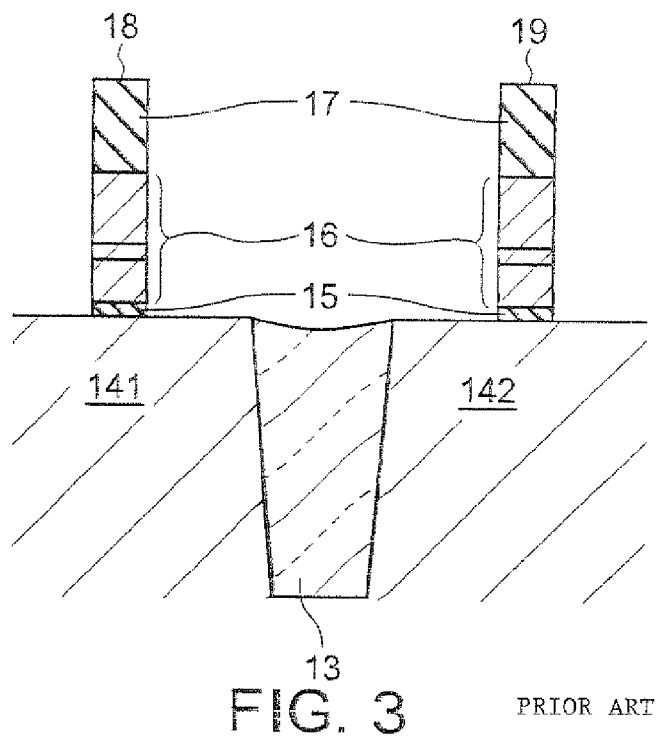
FIG. 3 is a view explanatory of a process to be performed after the process shown in FIG. 2.
Figure 4:
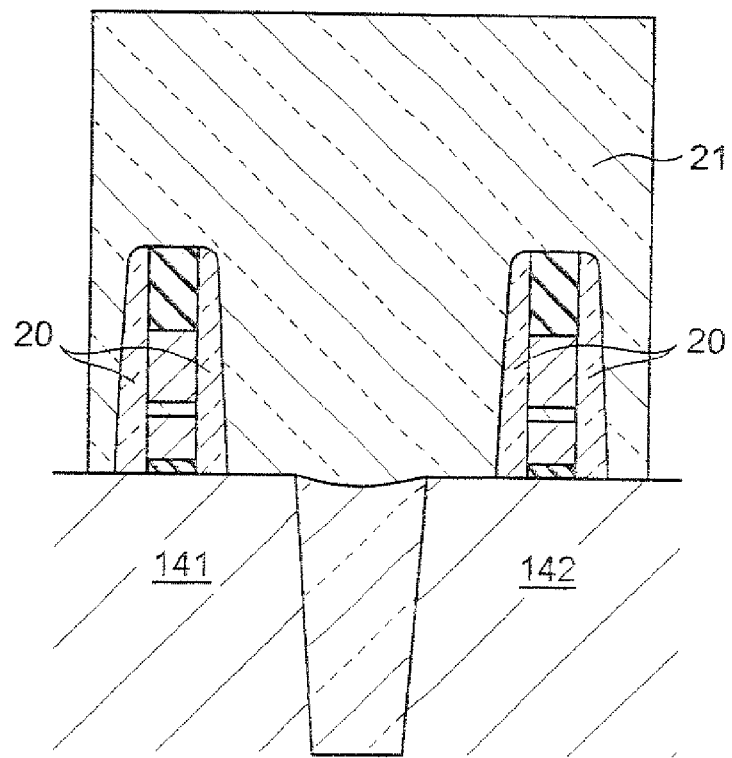
FIG. 4 is a view explanatory of a process to be performed after the process shown in FIG. 3.
Figure 5:
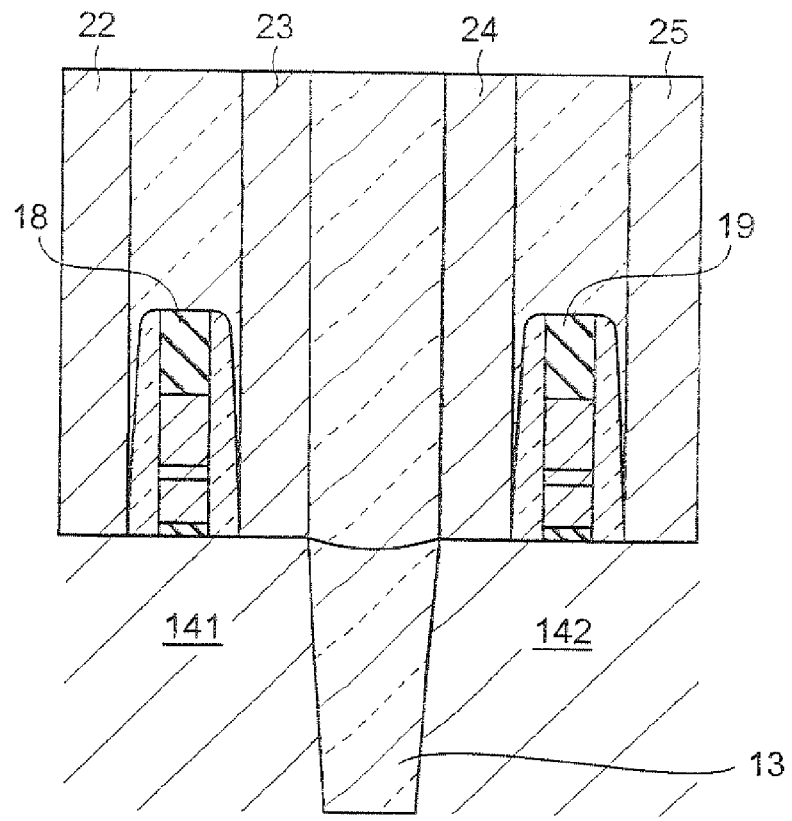
FIG. 5 is a cross-sectional view explanatory of a semiconductor device manufactured with use of conventional STI technology.

The illustrated first gate portion 106a of the first transistor 90a includes a lower gate part 200 and an upper gate part 202. The lower gate part 200 and the upper gate part 202 are electrically connected to each other by a gate connection part 204. Specifically, the first gate portion 106a has a two-stage structure in which the upper gate part 202 is stacked on the lower gate part 200. The first gate portion 106a is embedded in the insulator films 122 and 124. On the other hand, the second gate portion 106b of the second transistor 90b has one stage of a gate part. The second gate portion 106b is embedded in the insulator film 124. Each of the gate parts in the first and second gate portions 106a and 106b has the same structure as that of the gates 18 and 19 shown in FIG. 5. The first gate portion 106a differs from the second gate portion 106b in that it has a structure in which the lower gate part 200 and the upper gate part 202 are electrically connected to each other by the gate connection part 204.

A silicon nitride film is formed as a sidewall insulator film 126 at a boundary between the insulator film 122 and the silicon layer 160. Specifically, a side surface of the silicon layer 160 is covered with the sidewall insulator film 126 of the silicon nitride film. Furthermore, a p-well 128 is formed within the silicon layer 160. The first transistor 90a and the second transistor 90b are insulated from each other by the sidewall insulator film 126 and the p-well 128. In other words, the first transistor 90a and the second transistor 90b are insulated from each other not only by the silicon layer 160, but also by the sidewall insulator film 126 and the p-well 128.

Figure 8:
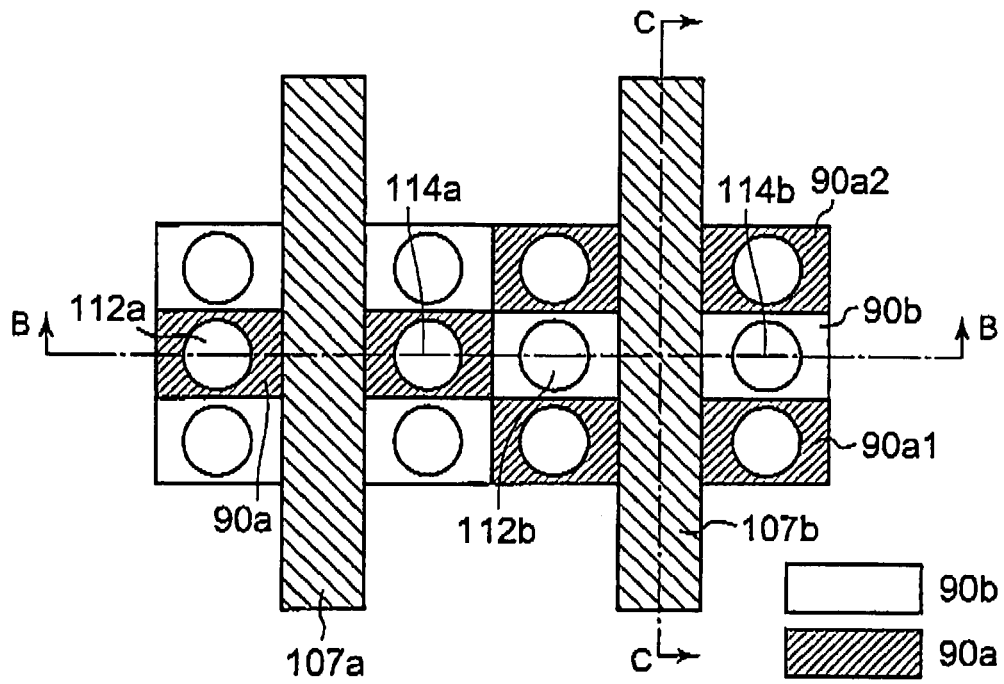
FIG. 8 is a plan view explanatory of a semiconductor device according to the present invention.

FIG. 8 is a plan view of the semiconductor device shown in FIG. 7. FIG. 7 is a cross-sectional view taken along line B-B of FIG. 8. In FIG. 8, in order to differentiate first transistors 90a and second transistors 90b from each other, the first transistors 90a formed on the silicon substrate 100 are illustrated with hatching while the second transistors 90b formed on the silicon layer 160 are illustrated without hatching. In the following description, the first transistors 90a formed at a location lower than the location of the silicon layer 160 on the silicon substrate 100 are generically referred to as lower transistors, and the second transistors 90b formed on the silicon layer 160 are generically referred to as upper transistors.

Figure 6:
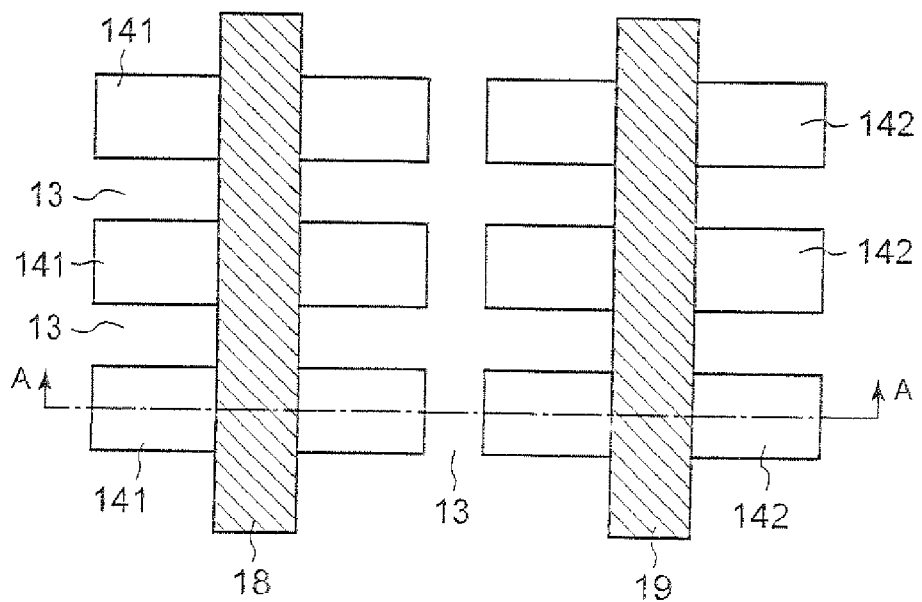
FIG. 6 is a plan view of the semiconductor device shown in FIG. 5.

As shown in FIG. 8, a first common gate portion 107a and a second common gate portion 107b are spaced at a predetermined interval from each other and formed so as to extend in the longitudinal direction (i.e., the column direction) as with the conventional example shown in FIG. 6. Specifically, for the first common gate portion 107a, the upper transistors and the lower transistors sharing the first common gate portion 107a are arranged alternately in the column direction without any STI interposed therebetween. For the second common gate portion 107b, the lower transistors and the upper transistors sharing the second common gate portion 107b are arranged alternately in the column direction without any STI interposed therebetween.

Furthermore, the upper transistors and the lower transistors arranged in the transverse direction (i.e., the row direction) of FIGS. 7 and 8 are also disposed without any STI interposed therebetween. A positional relationship between the upper transistors and the lower transistors in a certain row is reversed into a positional relationship between the lower transistors and the upper transistors in its adjacent row. As a result, the upper transistors and the lower transistors are two-dimensionally staggered without any STI interposed therebetween.

As is apparent from comparison of FIG. 8 with FIG. 6, the arrangement shown in FIG. 8 allows transistors to be integrated at a higher density in the row direction and the column direction and also allows a required area for the transistors to be reduced to about two-thirds, as compared to the arrangement having STI as shown in FIG. 6.

Figure 9:
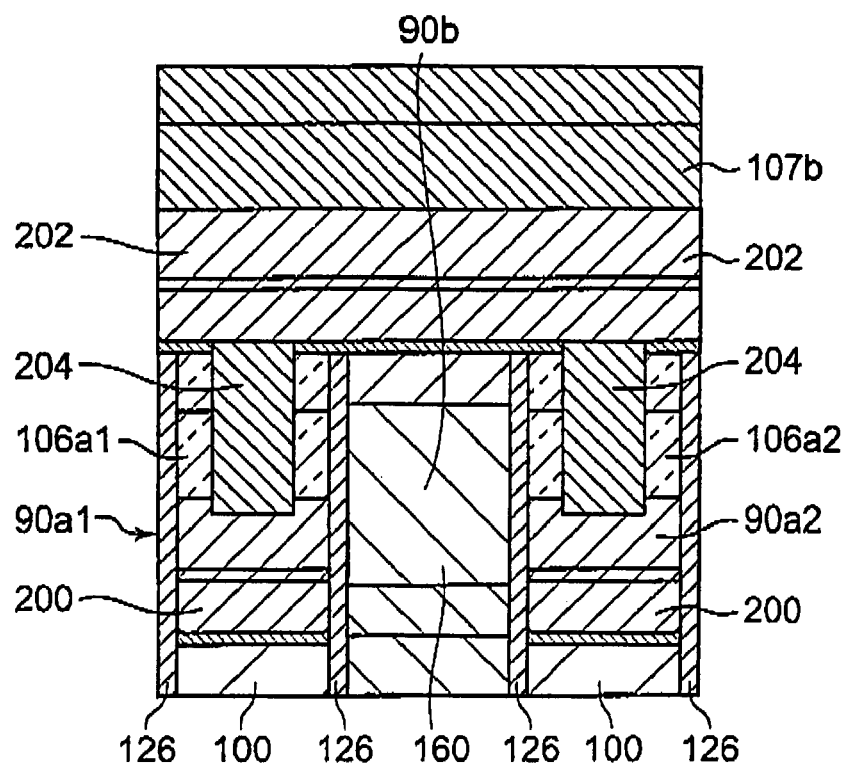
FIG. 9 is a cross-sectional view of the semiconductor device taken along line C-C of FIG. 8.

FIG. 9 shows a cross-section taken along line C-C of FIG. 8 to explain the details of the structure of the semiconductor device according to the present invention shown in FIG. 7.

FIG. 9 illustrates a lower transistor 90a1, an upper transistor 90b, and a lower transistor 90a2 sharing the second common gate portion 107b shown in FIG. 8. The first and second common gate portions 107a and 107b are formed by the upper gate part 202 of the first gate portion 106a and the second gate portion 106b (FIG. 7), respectively.

As described above, the upper transistor 90b is formed on the silicon layer 160. On the other hand, the lower transistors 90a1 and 90a2 are formed on the silicon substrate 100. The illustrated lower transistors 90a1 and 90a2 have first gate portions 106a1 and 106a2, respectively. Each of the first gate portions 106a1 and 106a2 includes a lower gate part 200 and an upper gate part 202. The upper gate parts 202 form a portion of the second common gate portion 107b. The gate portion 106b of the upper transistor 90b (FIG. 7) forms a portion of the common gate portion 107b.

Furthermore, sidewall insulator films 126 of silicon nitride films are formed between the lower transistor 90a1 and the upper transistor 90b and between the upper transistor 90b and the lower transistor 90a2 so as to insulate the upper and lower transistors from each other. In the illustrated example, the sidewall insulator films 126 extend to positions located below the active regions formed on the silicon substrate 100.

As is apparent from FIG. 9, the active region of the upper transistor 90b is located on substantially the same plane as planes on which the upper surfaces of the lower gate parts 200 of the lower transistors 90a1 and 90a2 are located. The upper gate parts 202 are formed on this plane as part of the second common gate portion 107b (particularly the common gate electrode). Furthermore, gate electrodes of the lower gate parts 200 are electrically connected to the upper gate parts 202 by gate connection parts 109a1 and 109a2.

Since the above explanation can also be applied to the first common gate portion 107a, the first common gate portion 107a will not be described repetitively.

Next, a method of manufacturing a semiconductor device according to the embodiment of the present invention shown in FIGS. 7 to 9 will be described in the order of processes with reference to FIGS. 10 to 13. For the sake of brevity, the following description relates to only the cross-section along line B-B of FIG. 8. Accordingly, as with FIG. 7, the first transistor 90a and the second transistor 90b arranged in the row direction will mainly be described below.

Figure 10:
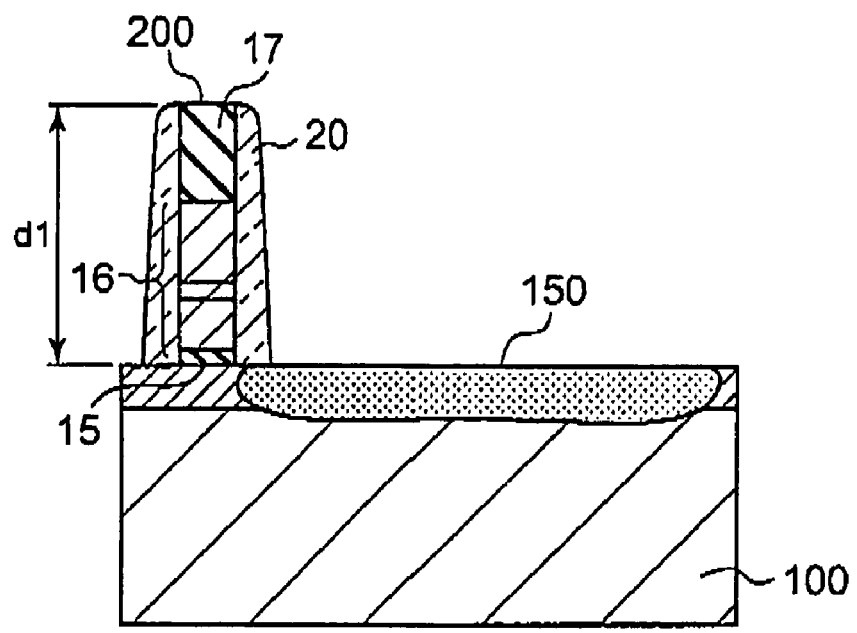
FIG. 10 is a view explanatory of a process in a method of manufacturing a semiconductor device according to an embodiment of the present invention.

Referring to FIG. 10, a lower gate part 200 of a first transistor, i.e., a lower transistor 90a, is formed on a p-type silicon substrate 100. The illustrated lower gate part 200 includes a gate insulator film 15, a gate electrode 16, a cover insulator film 17, and sidewalls 20 covering side surfaces of the gate insulator film 15, the gate electrode 16, and the cover insulator film 17. In this example, the gate insulator film 15 is formed of a silicon oxide film. The gate electrode 16 has a thickness of about 140 nm. The gate electrode 16 has a three-layer structure including a polycrystalline silicon layer and a tungsten layer. Furthermore, the gate electrode 16 has a surface covered with the cover insulator film 17 formed of a silicon nitride film. The sidewalls 20 are also formed of silicon nitride films.

In FIG. 10, phosphorus is implanted by LDD in a state such that a portion of the lower gate part 200 has been formed on the p-type silicon substrate 100. As a result, a partial region 150 containing n-type impurities which are to be source and drain regions of an NMOS transistor is formed. It is assumed that the illustrated height d1 of the lower gate part 200 is 300 nm.

Then an insulator film 122 having a thickness d2 is formed on the surface of the p-type silicon substrate 100 and on the lower gate part 200 shown in FIG. 10. The thickness d2 of the insulator film 122 is larger than the thickness d1 of the lower gate part 200. Practically, the thickness d2 of the insulator film 122 is set to be a thickness having a margin for preventing gate exposure during CMP, for example, 350 nm. After the formation of the insulator film 122, CMP is performed to flatten a surface of the insulator film 122. Then, while a photoresist is used as a mask, the insulator film 122 and the first gate portion 106a are selectively dry-etched.

Figure 11:
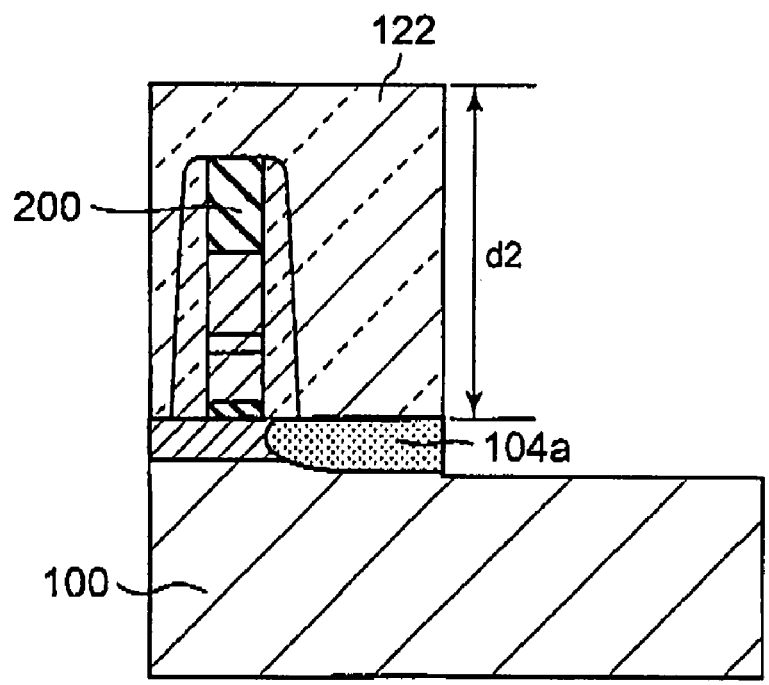
FIG. 11 is a view explanatory of a process to be performed after the process shown in FIG. 10.

As a result of the etching, as shown in FIG. 11, the insulator film 122 remains above the lower gate part 200 while a portion of the partial region 150 formed in the silicon substrate 100 is removed deeper than a bottom of the partial region 150 together with its peripheral portion. Thus, a source region 102a and a drain region 104a remain on the silicon substrate 100. At that time, side surfaces of the region 104a and the silicon substrate 100 are exposed.

Figure 12:
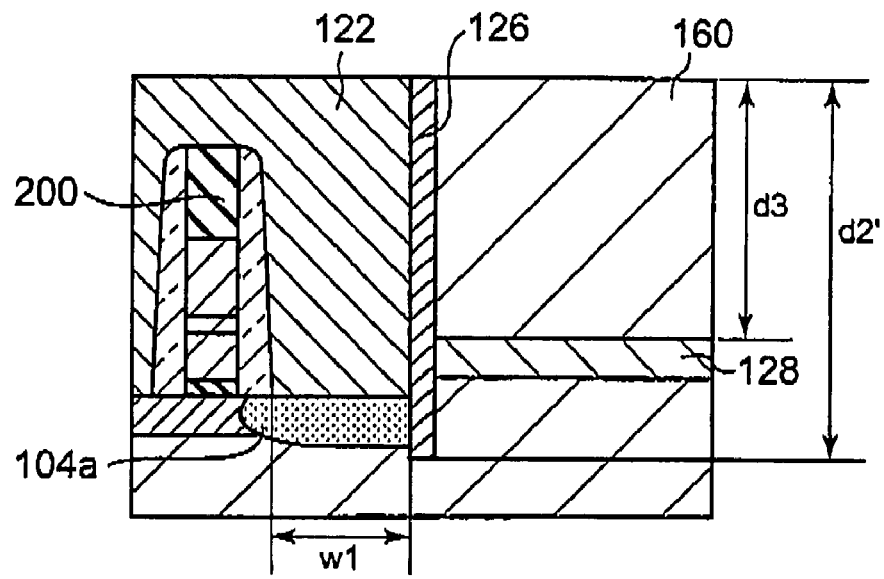
FIG. 12 is a view explanatory of a process to be performed after the process shown in FIG. 11.

Subsequently, the entire surface including the exposed silicon substrate 100 is clad with a silicon nitride film. The silicon nitride film is removed from the surface of the insulator film 122 and the surface of the silicon substrate 100 by etchback. Thus, as shown in FIG. 12, a silicon nitride film 126 is left as a sidewall of an insulator film on a side surface of the insulator film 122. The silicon nitride film 126 on the side surface of the insulator film 122 extends to a position lower than bottoms of the source and drain regions 102a and 104a to thereby insulate the source and drain regions 102a and 104a, which are adjacent to each other in a plan view, from each other.

The sidewall of an insulator film may be formed by a silicon oxide film or a stacked film of a silicon nitride film and a silicon oxide film.

As shown in FIG. 12, after the silicon nitride film 126 is formed on the side surface of the insulator film 122, a p-type silicon layer 160 is formed on the exposed silicon substrate 100 by selective epitaxial growth.

The selective epitaxial growth can be performed under a hydrogen atmosphere using dichlorsilane ($SiH_2Cl_2$) and hydrogen chloride (HCl) as material gases in a temperature range of 750° C. to 850° C. In this selective epitaxial growth, while the silicon substrate 100 serves as a seed, monocrystalline silicon grows on the silicon substrate 100 but not on the insulator film. At that time, the selectivity varies depending upon materials of insulator films. A silicon oxide film is most likely to have the selectivity. Accordingly, it is desirable that the surface of the sidewall is covered with a silicon oxide film.

Even if silicon also grows abnormally on the insulator film 122 because of incapability of maintaining the selectivity, the grown silicon can be removed by a CMP process for forming a gate connection part. Furthermore, introduction of impurities can be performed by mixing a dopant gas during the growth. Diborane ($B_2H_6$) may be used in a case of p-type impurities, and phosphine ($PH_3$) may be used in a case of n-type impurities. Alternatively, impurities may be introduced by ion implantation after selective growth of non-doped silicon.

The height d2' of the silicon layer 160 is set to be equal to or slightly smaller than the height d2 of the insulator film 122. It is assumed that a distance between the lower gate part 200 and the silicon layer 160 (a distance between the lower gate part 200 and the sidewall insulator film 126) is w1. For isolation from an adjacent element, i.e., the first transistor 90a, a well isolation region 128 is formed by implantation as with FIG. 7. The depth d3 at which the well isolation region 128 is provided from an upper surface of the silicon layer 160 is set to be slightly smaller than the height d2' of the silicon layer 160.

Then a gate connection part 204 connected to the gate electrode 16 of the lower gate part 200 is formed in the following manner. First, a contact hole is formed by lithography and dry etching so that the contact hole extends through the insulator film 122 and the cover insulator film 17 of the lower gate part 200. Thereafter, a phosphorus-doped silicon film is deposited on the overall surface so that the contact hole is filled with the phosphorus-doped silicon film. The phosphorus-doped silicon film is removed from an upper surface of the insulator film 122 to thereby form the gate connection part 204.

Figure 13:
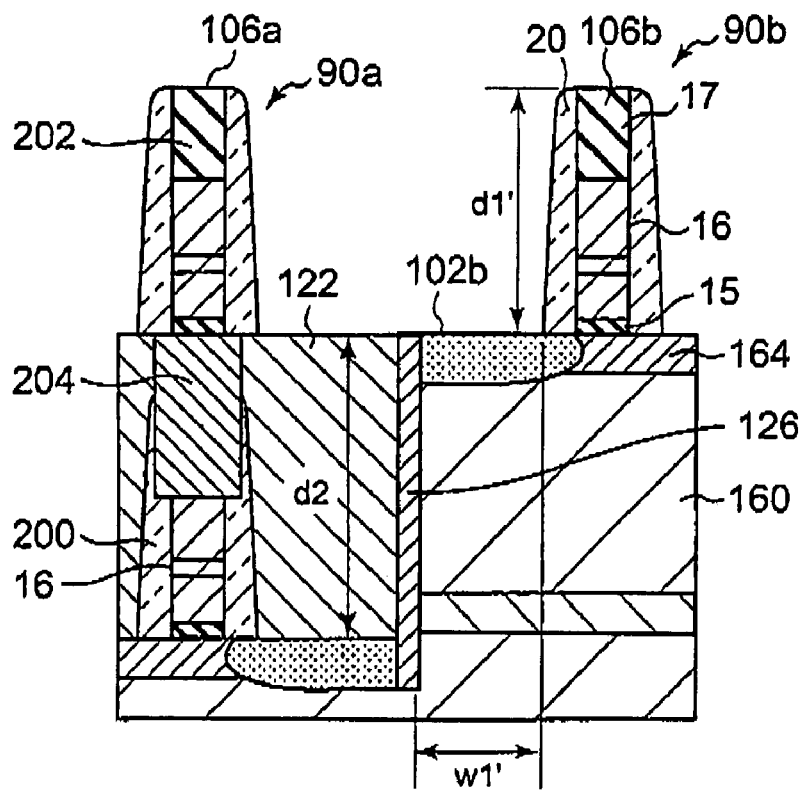
FIG. 13 is a view explanatory of a process to be performed after the process shown in FIG. 12.

Subsequently, as shown in FIG. 13, a p-well 164 is implanted on a channel region of the NMOS transistor. A second gate portion 106b of a second transistor 90b, i.e., the upper transistor, is formed on the surface of the silicon layer 160 in the same manner as in the process for forming the lower gate part 200 of the first transistor 90a.

At that time, an upper gate part 202 of the first transistor 90a is simultaneously formed. As with the lower gate part 200, the upper gate part 202 of the first transistor 90a includes a gate insulator film 15, a gate electrode 16 having a three-layer structure, a cover insulator film 17, and sidewalls 20. When the gate insulator film 15 is formed, a silicon oxide film is also formed on a surface of the gate connection part 204 of the lower gate part 200. Accordingly, before the formation of the gate electrode 16 in the upper gate part 202, the silicon oxide film is removed from the surface of the gate connection part 204 by lithography and etching. After the formation of the upper gate part 202, n-type impurities (e.g., phosphorus) are implanted into the silicon layer 160 at a location adjacent to the second gate portion 106b to thereby form source and drain regions 102b of the upper transistor 90b. The height d1' of the second gate portion 106b is set to be approximately equal to the height d1 of the first gate portion 106a. A distance w1' between the second gate portion 106b and the insulator film 122 (a distance between the second gate portion 106b and the sidewall insulator film 126) is set to be approximately equal to the distance w1 between the first gate portion 106a and the sidewall insulator film 126.

Figure 14:
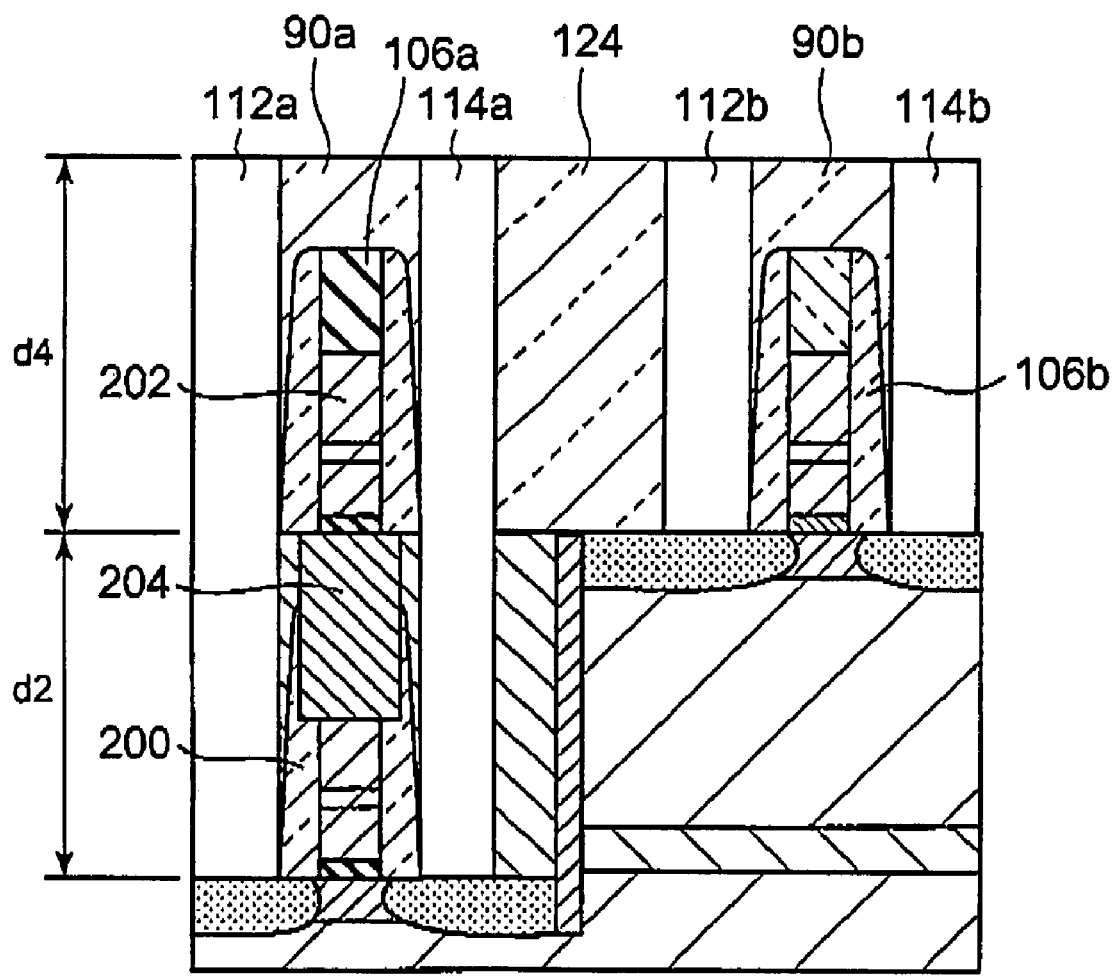
FIG. 14 is a view explanatory of a process to be performed after the process shown in FIG. 13.

Subsequently, as shown in FIG. 14, an insulator film 124 is formed on surfaces of the first and second gate portions 106a and 106b of the lower transistor 90a and the upper transistor 90b. Then CMP is performed on the insulator film 124 so as to form an interlayer dielectric film. The height d4 of the illustrated insulator film 124 is set to be approximately equal to the height d2 of the insulator film 122. Furthermore, contact holes 112a, 114a, 112b, and 114b are formed above the respective source and drain regions of the transistors. In this manner, it is possible to obtain a semiconductor device with the first gate portion 106a having the structure shown in FIG. 7.

Figure 15:
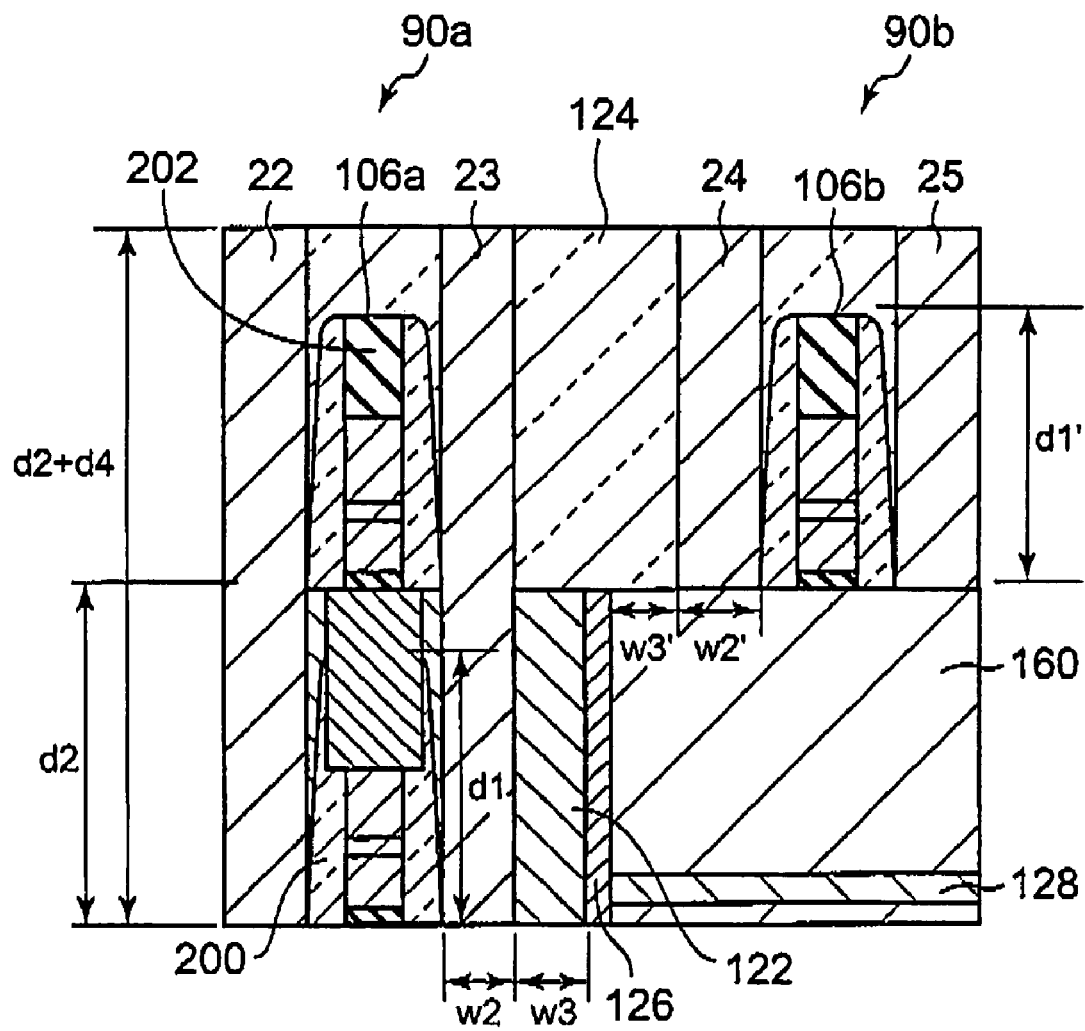
FIG. 15 is a view explanatory of a semiconductor device according to an embodiment of the present invention.

Next, as shown in FIG. 15, while a photoresist is used as a mask, source/drain contacts 22, 23, 24, and 25 are formed within the contact holes 112a, 114a, 112b, and 114b by dry-etching the insulator films 122 and 124. In this manner, a semiconductor device according to the embodiment of the present invention is produced. Specifically, the source/drain contacts 22 and 23 are formed on the silicon substrate 100 for the first gate portion 106a of the transistor 90a, and the source/drain contacts 24 and 25 are formed on the silicon substrate 100 for the second gate portion 106b of the transistor 90b.

In the illustrated example, the contacts 22 and 23 have a depth of d2+d4, and the contacts 24 and 25 have a depth of d4. The diameter w2 of the contact 23 is enough to have a margin required for a distance w3 between the contact 23 and the sidewall insulator film 126. For example, the diameter w2 of the contact 23 is w3 (=(w1−w2)/2)). The diameter w2' of the contact 24 is enough to have a margin required for a distance w3' between the contact 24 and the sidewall insulator film 126. For example, the diameter w2' of the contact 24 is w3' (=(w1'−w2)/2)). In this case, assuming that w1 (w1')=200 nm and w2=100 nm, w3 (w3') is about 50 nm.

As is apparent from FIG. 15, the lower transistor (i.e., the first transistor) 90a is formed on the silicon substrate 100. The upper transistor (i.e., the second transistor) 90b is formed on the silicon layer 160, which has been formed on the surface of the silicon substrate by selective epitaxial growth. There is no STI provided between the first transistor 90a and the second transistor 90b. With such a configuration, the first and second transistors 90a and 90b are electrically insulated from each other by the silicon layer 160.

In the illustrated example, the distance w1 between an edge of the first gate portion 106a of the first transistor 90a and an edge of the silicon layer 160 (the sidewall insulator film 126) is set to be approximately equal to the distance w1' between an edge of the gate 19 of the second transistor 90b and an edge of the silicon layer 160 (the sidewall insulator film 126).

Furthermore, the first transistor 90a is covered with the first interlayer dielectric film (the insulator film 122) and the second interlayer dielectric film (the insulator film 124). The thickness d2 of the insulator film 122 is set to be approximately equal to the thickness d4 of the insulator film 124.

Next, there will be described an example in which a CMOS transistor is produced as a semiconductor device according to another embodiment of the present invention. In this example, the CMOS transistor includes a lower transistor 90a of an NMOS transistor and an upper transistor 90b of a PMOS transistor. In this case, the aforementioned processes including the formation of the lower transistor 90a, the selective etching of the silicon substrate 100, the formation of the sidewall insulator film 126 of the silicon nitride film, and the formation of the p-type silicon layer 160 in the first embodiment, i.e., the processes shown in FIGS. 10 to 12, can also be applied to this embodiment. As a result, a lower gate part 200 forming a portion of a first gate portion 106a in the lower transistor 90a is formed on a silicon substrate 100, and a lower gate part 200 is embedded in an insulator film 122.

Figure 16:
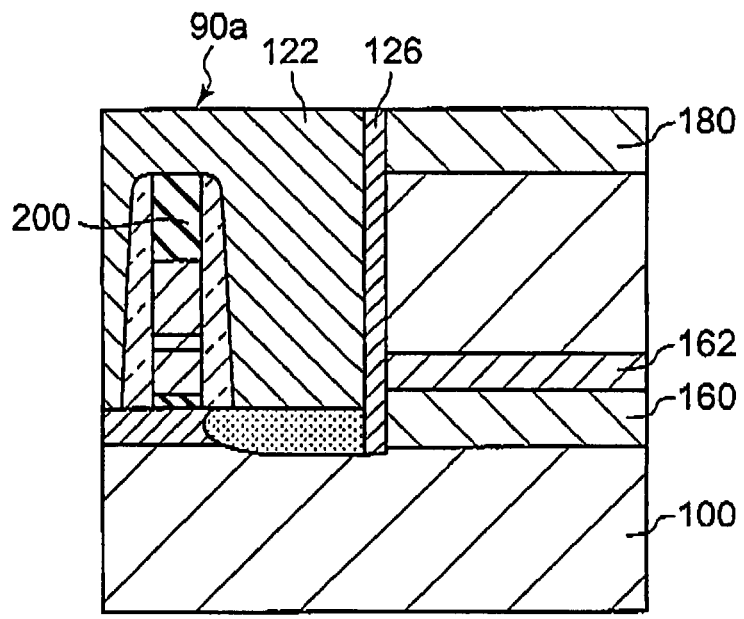
FIG. 16 is a view explanatory of a process in a method of manufacturing a semiconductor device according to another embodiment of the present invention.

Referring to FIG. 16, p-type impurities such as boron are implanted in the interior of the processed silicon layer 160 so as to form a p-well 162, N-type impurities such as phosphorus are implanted into a surface of the silicon layer 160 so as to form an n-well 180.

Figure 17:
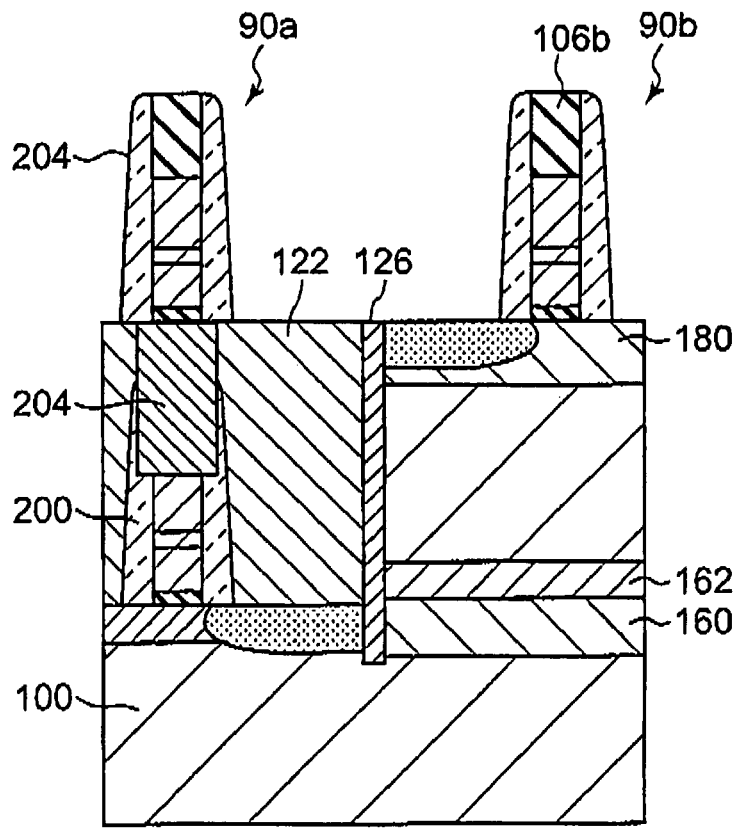
FIG. 17 is a view explanatory of a process to be performed after the process shown in FIG. 16.

As shown in FIG. 17, a second gate portion 106b of a PMOS transistor as the upper transistor 90b is formed on a surface of the silicon layer 160 having the n-well 180 formed thereon. The first gate portion 106a is formed by forming an upper gate part 202 of the lower transistor 90a concurrently with the formation of the second gate portion 106b. As described above, the lower gate part 200 and the upper gate part 202 are connected to each other by a gate connection part 204.

Figure 18:
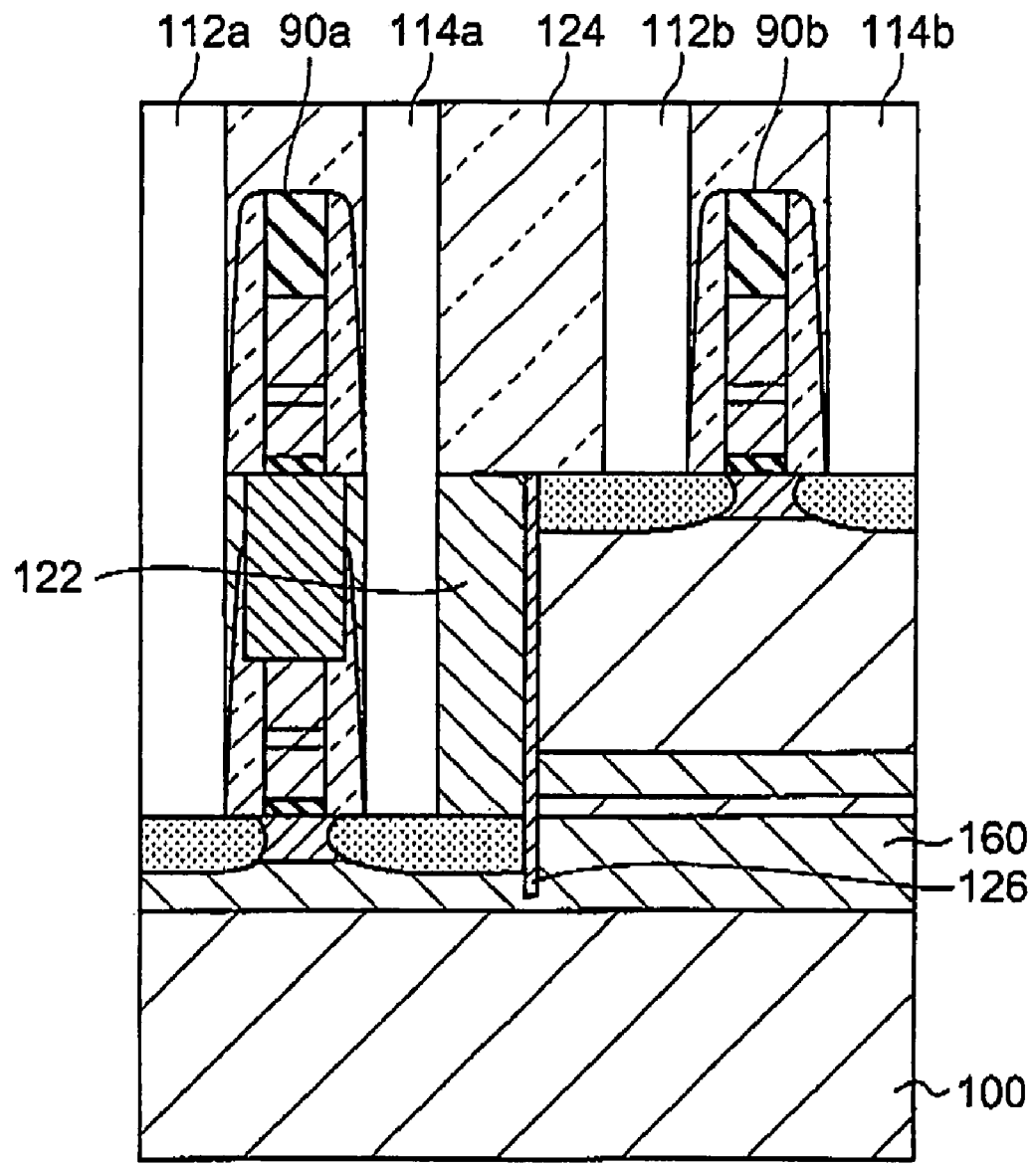
FIG. 18 is a view explanatory of a process to be performed after the process shown in FIG. 17.

Subsequently, as described with reference to FIG. 14, the gate 106b is covered with an insulator film, and then contact holes 112a, 114a, 112b, and 114b are formed as shown in FIG. 18. Thereafter, contacts are formed within the contact holes 112a, 114a, 112b, and 114b. In this manner, it is possible to produce a CMOS transistor having a structure similar to that of FIG. 15.

According to this embodiment, it is possible to produce a CMOS transistor integrated to a higher degree as compared to a case in which trenches are formed between elements.

In the aforementioned embodiments, a step is formed by epitaxial growth of a silicon layer on a silicon substrate. However, a step may be formed on a silicon substrate by etching a portion of the silicon substrate.

A semiconductor device according to the present invention is applicable not only to DRAMs or CMOS transistors, but also to various kinds of highly integrated semiconductor elements or circuits.

Although certain preferred embodiments of the present invention have been shown and described in detail, it should be understood that various changes and modifications may be made therein without departing from the scope of the appended claims.

What is claimed is:

1. A semiconductor device comprising:
   a first transistor formed on a first silicon surface; and
   a second transistor formed on a second silicon surface located at a height different from a height of the first silicon surface, said first transistor and said second transistor being insulated from each other by a well of a first conductivity type buried beneath the second silicon surface and separated from the second transistor by a silicon layer.

2. The semiconductor device as recited in claim 1, further comprising:
   a silicon substrate having a surface forming the first silicon surface; and
   a sidewall of an insulator film on a side surface of the silicon layer,
   wherein the silicon layer is on a surface of said silicon substrate and has a surface forming the second silicon surface located higher than the first silicon surface.

3. The semiconductor device as recited in claim 1, including no STI provided between said first transistor and said second transistor.

4. The semiconductor device as recited in claim 1, wherein the well has a portion at a height above the height of the first silicon surface.

5. A semiconductor device comprising:
   a first transistor formed on a first silicon surface;
   a second transistor formed on a second silicon surface located at a height different from a height of the first silicon surface, said first transistor and said second transistor being insulated from each other;
   a lower transistor group including a plurality of said first transistors; and
   an upper transistor group including a plurality of said second transistors,
   wherein the first silicon surface and the second silicon surface are arranged alternately in a row direction and a column direction perpendicular to each other in a plan view,
   wherein said first transistors on the first silicon surface and said second transistors on the second silicon surface are staggered in the plan view.

6. The semiconductor device as recited in claim 5, further comprising a sidewall of an insulator film between a region for said second transistor formed on the second silicon surface and a region for said first transistor formed on the first silicon surface.

7. The semiconductor device as recited in claim 6, wherein each of said first transistor and said second transistor comprises a MOS transistor having the same conductivity.

8. The semiconductor device as recited in claim 7, wherein each of said first transistors in said lower transistor group includes a first gate portion having stacked partial gates,
   wherein each of said second transistors in said upper transistor group includes a second gate portion having a single stage structure.

9. The semiconductor device as recited in claim 8, wherein an upper surface of said first gate portion in each of said first transistors and an upper surface of said second gate portion in each of said second transistors are located on substantially the same plane.

10. The semiconductor device as recited in claim 9, further comprising a common gate electrode formed on the same plane as said upper surfaces of said first gate portions and said second gate portions so as to interconnect said first gate portions and said second gate portions of said first transistors and said second transistors arranged alternately in the column direction.

11. The semiconductor device as recited in claim 10, further comprising a p-type silicon substrate forming the first silicon surface,
   wherein each of said first transistors and said second transistors comprises an NMOS transistor.

12. The semiconductor device as recited in claim 6, wherein said first transistors and said second transistors comprise CMOS transistors formed by different conductive types of transistors.

13. The semiconductor device as recited in claim 12, wherein each of said first transistors in said lower transistor group includes a first gate portion having stacked partial gates,
 wherein each of said second transistors in said upper transistor group includes a second gate portion having a single stage structure.

14. The semiconductor device as recited in claim 13, wherein an upper surface of said first gate portion in each of said first transistors and an upper surface of said second gate portion in each of said second transistors are located on substantially the same plane.

15. The semiconductor device as recited in claim 14, further comprising a common gate electrode formed on the same plane so as to interconnect said first gate portions and said second gate portions of said first transistors and said second transistors arranged alternately in the column direction.

16. The semiconductor device as recited in claim 15, further comprising a p-type silicon substrate forming the first silicon surface,
 wherein each of said first transistors comprises an NMOS transistor,
 wherein each of said second transistors comprises a PMOS transistor.

17. A semiconductor device comprising:
 a silicon substrate;
 a first transistor formed on said silicon substrate;
 a silicon layer adjacent to said first transistor on a surface of said silicon substrate;
 a second transistor formed on said silicon layer so as to be isolated from said first transistor by said silicon layer; and
 a sidewall of an insulator film formed on a side surface of said silicon layer.

18. The semiconductor device as recited in claim 17, wherein a first distance between an edge of a first gate portion of said first transistor and said sidewall is substantially the same as a second distance between an edge of a second gate portion of said second transistor and said sidewall.

19. The semiconductor device as recited in claim 18, further comprising:
 a first insulator film covering said first transistor; and
 a second insulator film covering said first transistor and said second transistor and having substantially the same height as a height of said first insulator film.

* * * * *